(12) United States Patent
Adachi

(10) Patent No.: US 10,541,510 B2
(45) Date of Patent: Jan. 21, 2020

(54) SEMICONDUCTOR LIGHT-EMITTING DEVICE

(71) Applicant: Lumentum Japan, Inc., Kanagawa (JP)

(72) Inventor: Koichiro Adachi, Tokyo (JP)

(73) Assignee: Lumentum Japan, Inc., Kanagawa (JP)

(*) Notice: Subject to any disclaimer, the term of this patent is extended or adjusted under 35 U.S.C. 154(b) by 0 days.

(21) Appl. No.: 16/047,023

(22) Filed: Jul. 27, 2018

(65) Prior Publication Data

US 2019/0044301 A1 Feb. 7, 2019

(30) Foreign Application Priority Data

Aug. 2, 2017 (JP) .................... 2017-150049
Jun. 8, 2018 (JP) .................... 2018-110058

(51) Int. Cl.

| | |
|---|---|
| *H01S 5/026* | (2006.01) |
| *H01S 5/022* | (2006.01) |
| *H01S 5/12* | (2006.01) |
| *H01S 5/062* | (2006.01) |
| *H01S 5/0625* | (2006.01) |
| *H01P 3/08* | (2006.01) |
| *G02F 1/21* | (2006.01) |

(Continued)

(52) U.S. Cl.
CPC ...... *H01S 5/02236* (2013.01); *G02F 1/01716* (2013.01); *G02F 1/218* (2013.01); *H01P 3/081* (2013.01); *H01S 5/0085* (2013.01); *H01S 5/026* (2013.01); *H01S 5/0265* (2013.01); *H01S 5/02276* (2013.01); *H01S 5/06213* (2013.01); *H01S 5/06251* (2013.01); *H01S 5/12* (2013.01); *H03H 7/383* (2013.01); *G02F 2001/0155* (2013.01); *G02F 2001/212* (2013.01); *G02F 2202/101* (2013.01); *G02F 2202/102* (2013.01); *G02F 2202/108* (2013.01)

(58) Field of Classification Search
CPC .......................... H01S 5/0085; H01S 5/0265
See application file for complete search history.

(56) References Cited

U.S. PATENT DOCUMENTS

| | | |
|---|---|---|
| 6,057,954 A | 5/2000 | Parayanthal et al. |
| 2012/0183306 A1 | 7/2012 | Inoue |

(Continued)

FOREIGN PATENT DOCUMENTS

JP    2012-151244 A    8/2012

*Primary Examiner* — Michael Carter
(74) *Attorney, Agent, or Firm* — Harrity & Harrity, LLP

(57) ABSTRACT

The first transmission line has a width perpendicular to a transmission direction. The first electrode has a width not exceeding the width. The first electrode is opposed to the first transmission line. The ground layer has a positional relationship with each portion of the first transmission line. The ground layer is next to the first transmission line on at least one side consisting of a first side along a thickness direction of the mounting substrate, and a second side and a third side with the first transmission line interposed therebetween. The first transmission line is bonded to the first electrode and has the width equivalently, at least, at a portion of the first transmission line. The portion equivalently has the positional relationship with the ground layer. The portion is next to the ground layer in an equivalent shape along the transmission direction.

24 Claims, 15 Drawing Sheets

(51) Int. Cl.
  G02F 1/017 (2006.01)
  H03H 7/38 (2006.01)
  H01S 5/00 (2006.01)
  G02F 1/015 (2006.01)

(56) References Cited

U.S. PATENT DOCUMENTS

2013/0272326 A1\* 10/2013 Yamatoya ............... H01S 3/10
                                                   372/26
2014/0198816 A1   7/2014 Margalit et al.

\* cited by examiner

SEMICONDUCTOR LIGHT-EMITTING DEVICE

CROSS-REFERENCE TO RELATED APPLICATION

The present application claims priority from Japanese application JP2017-150049 filed on Aug. 2, 2017 and Japanese application JP2018-110058 filed on Jun. 8, 2018, the content of which is hereby incorporated by reference into this application.

BACKGROUND

This relates to semiconductor light-emitting devices.

Some modulator may have a quantum well layer and a bulk layer interposed between a p-type semiconductor layer and a n-type semiconductor layer, to modulate light passing through a layer such as the quantum well layer, by applying an electric field and changing absorptance or a refractive index. One example is known as an electric field absorption-type modulator (EA modulator), and another example is known as a Mach-Zehnder modulator (MZ modulator). Alternating current signals (AC signals) in a single ended mode are applied to the modulators (specifically, EA modulator). Recently, for improving quality of electric signals and for low-voltage drive (low amplitude drive), another mode to apply electric signals by differential signals has begun to be used. For example, JP 2012-151244 A and US 2014/0198816 A1 disclose a semiconductor light-emitting device, where an EA modulator and a semiconductor laser (light source) are integrated on the same substrate and the EA modulator is driven in a differential drive mode.

The differential drive mode for driving a modulator has problems as follows:

[Problem 1]

Two types of modulators are known: One is equipped with an electrode on one side for a p-type semiconductor layer and with another electrode on an opposite side for an n-type semiconductor layer. The other is equipped with the both electrodes for the p-type semiconductor layer and the n-type semiconductor layer on the same side. The modulator is mounted on an element mounting surface of a submount (e.g. carrier, mounting substrate) with a pair of differential transmission lines formed thereon. The type of modulators with the electrodes on both sides may have lower electrodes (mainly for n-type semiconductor layer) connected to one of a pair of differential transmission lines (e.g. cathode line) with solder or brazing material and may have upper electrodes (mainly for p-type semiconductor layer) connected to the other of the pair of differential transmission lines (e.g. anode line) with a wire.

The anode line has ideal impedance just before the wire. By contrast, the cathode line is bonded to the electrode of the modulator with the solder or brazing material, having a connection portion in a shape equal to or larger than the electrode, causing electrical reflection. The differential drive requires equality of electric signal quality between the anode line and the cathode line. The major factor of the above reflection, which is only inherent in the cathode line, downgrades the electric signals and optical waveform quality (optical signal quality) after modulation.

[Problem 2]

The type of modulators with the electrodes on both sides may have large differences in configuration from the quantum well layer to the electrode. In general, the quantum well layer has a width as narrow as some micrometers, for improving optical and electrical confinement properties. The distance from the quantum well layer to the electrode for the p-type semiconductor layer is as small as some micrometers. By contrast, the n-type semiconductor layer under the quantum well layer is as large in size as a substrate, as large as a rectangle with a side of more than 100 μm, as thick as about 100 μm.

The quantum well layer, to which the electric field is really applied, is almost thousand times farther from the electrode for the p-type semiconductor layer than from the electrode for the n-type semiconductor layer, differentiating respective impedance characteristics from the quantum well layer to the respective electrodes. In spite of applying the same electric signal (with the same impedance characteristics) from both sides, unbalanced differential signals are actually applied and the optical waveform quality deteriorates.

[Problem 3]

The modulators tend to be used with a termination resistor (matching resistance, matching resistance) positioned parallel thereto, for impedance matching (e.g. 100Ω for a differential drive) with a driver IC. Wires are used for connection from the transmission line to the electrode for the p type semiconductor and other connection to the termination resistor (U.S. Pat. No. 6,057,954). Adjusting the length of the wires can improve the high frequency response characteristics (electro-optical (E/O) characteristics, S21 characteristics) of the modulator. To achieve the effect, the termination resistor is positioned on the opposite side of the modulator from the transmission line. This arrangement makes asymmetrical the elements affecting high-frequency characteristics from each of an anode line and a cathode line constituting a pair of differential transmission lines to the termination resistor.

On the side of the p-type semiconductor layer, one of the wires is provided between the electrode of the modulator and the termination resistor. On the side of the n-type semiconductor layer, the transmission line is connected to the electrode of the modulator with solder or brazing material, having a larger width and having inductance and capacitance. This differentiates the impedance characteristics from each of the anode line and the cathode line to the termination resistor, leading to an unbalanced transmission condition of the differential signals, degrading characteristics.

Regardless of the differential signals or a single ended signal, the termination resistor is generally set to have about a 50Ω impedance for driving impedance matching. Any factor included between the termination resistor and the transmission line may create an impedance mismatch and cause a malfunction of transmitting a desired voltage, for example.

This is to aim at impedance matching.

SUMMARY (1) Semiconductor light-emitting device may include: a light source; a modulator for modulating output light from the light source, the modulator having a first electrode and a second electrode; and a mounting substrate on which the light source and the modulator are mounted, the mounting substrate having a first transmission line electrically connected to the first electrode, the mounting substrate having a second transmission line electrically connected to the second electrode, the mounting substrate having a ground layer connected to a ground potential. The first transmission line and the second transmission line may constitute a pair of differential signal lines, the first transmission line may have a width perpendicular to a transmission direction, the first electrode may have a width not exceeding the width of the first transmission line, the first electrode being opposed to the first transmission line, the ground layer may have a positional relationship with each portion of the first transmission line, where the ground layer is next to the first transmission line on at least one side consisting of a first side along a thickness direction of the mounting substrate, and a second side and a third side with the first transmission line interposed therebetween, and the first transmission line may be bonded to the first electrode and may have the width equivalently, at least, at a portion of the first transmission line, the portion equivalently having the positional relationship with the ground layer, the portion being next to the ground layer in an equivalent shape along the transmission direction. This can make impedance matching in accordance with the uniformity of the width of the first transmission line.

(2) In the semiconductor light-emitting device according to (1), the modulator may have a quantum well layer for absorbing the output light, and a first conductivity-type semiconductor layer and a second conductivity-type semiconductor layer with the quantum well layer interposed therebetween, the first electrode may be on the first conductivity-type semiconductor layer for electrical connection, the second electrode may be on the second conductivity-type semiconductor layer for electrical connection, and the first electrode and the second electrode may face opposite directions.

(3) In the semiconductor light-emitting device according to (1) or (2), the second transmission line may have a width that is perpendicular to a transmission direction and is equal to the width of the first transmission line.

(4) In the semiconductor light-emitting device according to any one of (1) to (3), the width of the first transmission line may be larger than the width of the first electrode.

(5) In the semiconductor light-emitting device according to any one of (1) to (4), the first transmission line may have a first transmission portion including an opposed region to the first electrode, the first transmission line having a second transmission portion connected to the first transmission portion, the ground layer may have a first ground portion next to the first transmission portion on the first side, the ground layer having only one of a second ground portion next to the first transmission portion on the second side and a third ground portion next to the first transmission portion on the third side, the ground layer may have the first ground portion, the second ground portion, and the third ground portion next to at least a part of the second transmission portion, and the width of the first transmission line at the first transmission portion may be equivalent.

(6) In the semiconductor light-emitting device according to any one of (1) to (4), the first transmission line and the second transmission line may have respective planar shapes asymmetrical to each other, respective portions most remote from each other, and respective portions spaced apart from each other at various distances, and the first transmission line and the second transmission line have a common line length.

(7) In the semiconductor light-emitting device according to (6), the second transmission line may have one end of the line length closest to the first transmission line on a side of the modulator.

(8) In the semiconductor light-emitting device according to (6) or (7), the first transmission line may have one end of the line length beyond an electrical connection portion with the first electrode in the transmission direction.

(9) In the semiconductor light-emitting device according to any one of (6) to (8), the first transmission line and the second transmission line may extend to be closer to each other from both sides of the respective portions most remote from each other.

(10) In the semiconductor light-emitting device according to any one of (6) to (9), the first transmission line may have a first transmission portion including an opposed region to the first electrode and a portion most remote from the second transmission line, the first transmission line having a second transmission portion for connection with the first transmission portion, and the ground layer may have a first ground portion next to the first transmission portion and the second transmission portion on the first side, the ground layer having a second ground portion next to at least the second transmission portion on the second side, the ground layer having a third ground portion next to at least the second transmission portion on the third side.

(11) The semiconductor light-emitting device according to any one of (6) to (10), may further include: a matching resistor electrode next to the first transmission line; and a matching resistor electrically connected between the first transmission line and the matching resistor electrode. The second transmission line may be electrically connected with the matching resistor through the second electrode and the matching resistor electrode.

(12) Semiconductor light-emitting device may include: a light source; a modulator configured to have a quantum well layer for modulating output light from the light source is interposed between a first conductivity-type semiconductor layer and a second conductivity-type semiconductor layer; and a mounting substrate on which the light source and the modulator are mounted, the mounting substrate having a first transmission line extending from a first connection portion electrically connected to the first conductivity-type semiconductor layer, the mounting substrate having a second transmission line extending from a second connection portion electrically connected to the second conductivity-type semiconductor layer. The first transmission line and the second transmission line may constitute a pair of differential signal lines, and the first transmission line may have a width in a direction perpendicular to a transmission direction, the first connection portion having the width less than or equal to an adjoining part thereof, the first connection portion having characteristic impedance higher than the adjoining part. This can make impedance matching, in spite of the difference of the characteristic impedance between the first conductivity-type semiconductor layer and the second conductivity-type semiconductor layer, since the first connection portion has the higher characteristic impedance than the adjoining part.

(13) In the semiconductor light-emitting device according to (12), the first connection portion may have the width less than the adjoining part.

(14) In the semiconductor light-emitting device according to (12) or (13), the modulator may be mounted junction-up with the quantum well layer on a top side.

(15) In the semiconductor light-emitting device according to any one of (12) to (14), the modulator may have a first electrode electrically connected to and laminated on the first conductivity-type semiconductor layer and a second electrode electrically connected to and laminated on the second conductivity-type semiconductor layer, and the first electrode may be opposed to and bonded to the first connection portion.

(16) In the semiconductor light-emitting device according to (15), the first electrode may be wider than the width of the first connection portion.

(17) In the semiconductor light-emitting device according to (15) or (16), the first transmission line, except for the first connection portion, may have the width larger than the first electrode.

(18) In the semiconductor light-emitting device according to any one of (12) to (17), the mounting substrate may have a stud on at least one of both sides interposing the first connection portion therebetween, and the modulator may be mounted on the first connection portion and the stud.

(19) Semiconductor light-emitting device may include: a light source; a modulator for modulating output light from the light source; a mounting substrate on which the light source and the modulator are mounted, the mounting substrate having a first transmission line, a second transmission line, and a matching resistor; a first conductor for electrically connecting the modulator to the first transmission line; and a second conductor for electrically connecting the modulator to the second transmission line. The first transmission line and the second transmission line may constitute a pair of differential signal lines, and the matching resistor may be connected between the first transmission line and the second transmission line, without the first conductor or the second conductor being interposed therebetween. This can make impedance matching in a transmission route before the first conductor and the second conductor.

(20) In the semiconductor light-emitting device according to (19), the matching resistor may be electrically connected to the first transmission line before the first conductor in a transmission direction toward the modulator, and the matching resistor may be electrically connected to the second transmission line before the second conductor.

(21) In the semiconductor light-emitting device according to (19) or (20), the modulator may have a first electrode and a second electrode, the first conductor may be bonded to the first electrode, and the second conductor may be bonded to the second electrode.

(22) In the semiconductor light-emitting device according to (21), at least one of the first conductor and the second conductor may include a wire.

(23) In the semiconductor light-emitting device according to (21) or (22), at least one of the first electrode and the second electrode may be opposed to and electrically connected to the first transmission line or the second transmission line.

(24) In the semiconductor light-emitting device according to any one of (1) to (23), the light source and the modulator are mounted on a common substrate.

DETAILED DESCRIPTION OF THE INVENTION

Figure 1:
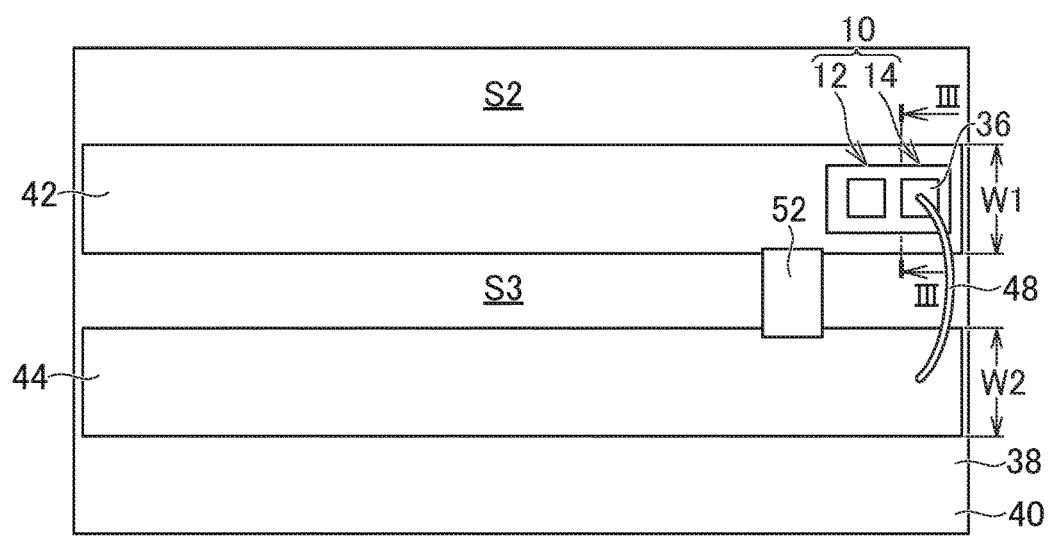
FIG. 1 is a plan view of a semiconductor light-emitting device in accordance with a first embodiment.

Hereinafter, embodiments will be described specifically and in detail with reference to drawings. In all the drawings for describing the embodiments, the same reference numerals are assigned to members having the same function and repetitive description thereof will be omitted. The following drawings merely illustrate examples of the embodiments, and sizes of the drawings and scales described in the examples do not necessarily coincide with each other.

First Embodiment

FIG. 1 is a plan view of a semiconductor light-emitting device in accordance with a first embodiment.

Figure 2:
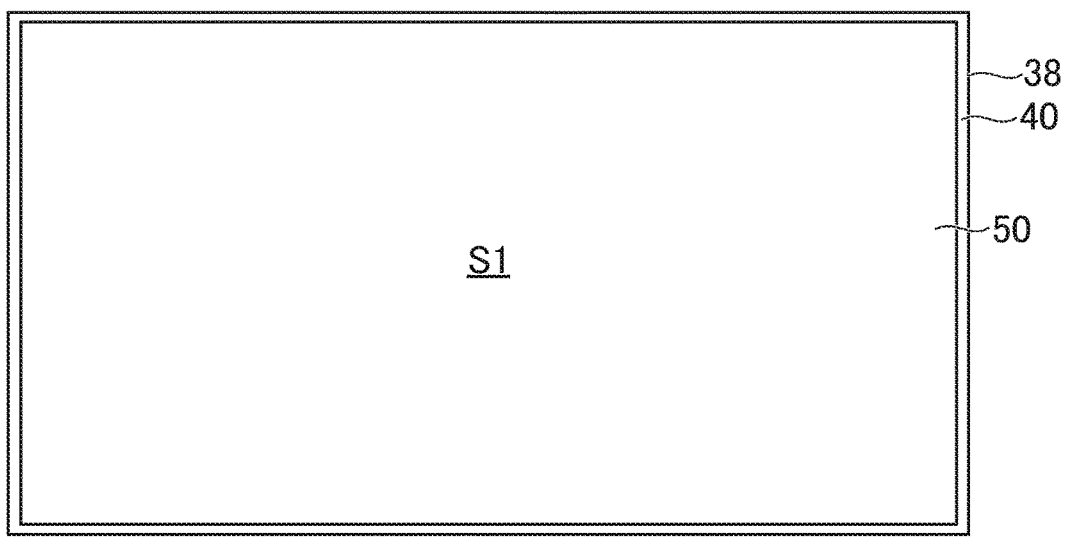
FIG. 2 is a bottom view of the semiconductor light-emitting device in FIG. 1.

FIG. 2 is a bottom view of the semiconductor light-emitting device in FIG. 1.

The semiconductor light-emitting device includes a light-emitting modulation element 10. The light-emitting modulation element 10 is configured to have a light source 12 and a modulator 14 monolithically integrated on a common substrate. The light source 12 is a distributed feedback semiconductor laser (DFB laser) for continuous oscillation by injecting a constant driving current. The modulator 14 is an electric field absorption modulator (EA modulator) or a Mach-Zehnder modulator for modulating output light from the light source 12.

Figure 3:
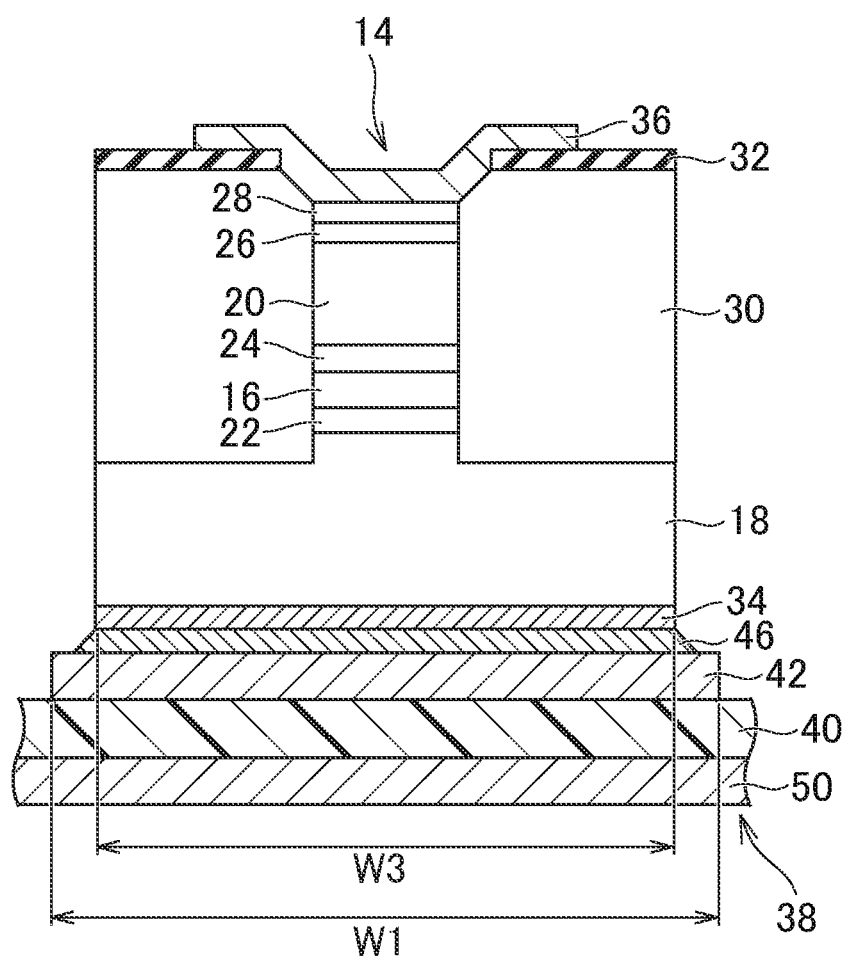
FIG. 3 is an enlarged III-III line cross-sectional view of the semiconductor light-emitting device in FIG. 1.

FIG. 3 is an enlarged III-III line cross-sectional view of the semiconductor light-emitting device in FIG. 1. Specifically, FIG. 3 is a cross-sectional view of the EA modulator. The modulator 14 has a quantum well layer 16 for absorbing the output light and has a first conductivity-type semiconductor layer 18 (e.g. n-type InP layer) and a second conductivity-type semiconductor layer 20 (e.g. p-type InP layer) with the quantum well layer 16 interposed therebetween. The quantum well layer 16 may be a multiple quantum well (MQW) layer. The quantum well layer 16 is interposed between an InGaAsP lower side light guide layer 22 and an InGaAsP upper side light guide layer 24.

The second conductivity-type semiconductor layer 20, from the light source 12 to the modulator 14, is a clad layer on which are laminated a p-type InGaAsP layer 26 and a p-type InGaAs layer 28 for contact layers, constituting an optical waveguide in a stripe shape. On its both sides, a Fe-doped InP-buried layer 30 is embedded. The buried layer 30 is covered with a passivation film 32.

The modulator 14 has a first electrode 34. The first electrode 34 is electrically connected to and laminated on the first conductivity-type semiconductor layer 18. The modulator 14 has a second electrode 36.

The second electrode 36 is electrically connected to and laminated on the second conductivity-type semiconductor layer 20. The first electrode 34 and the second electrode 36 face opposite directions.

The semiconductor light-emitting device has a mounting substrate 38. The mounting substrate 38 has a light-emitting modulation element 10 (light source 12 and modulator 14) mounted thereon. The modulator 14 is mounted junction-up with the quantum well layer 16 on a top side. The mounting substrate 38 has a base substrate 40 made from insulation materials such as AlN, epoxy, polyimide, and another resin.

The mounting substrate 38 has a first transmission line 42. The mounting substrate 38 has a second transmission line 44. The first transmission line 42 and the second transmission line 44 extend side by side on one surface of the base substrate 40, constituting a pair of differential signal lines. The first transmission line 42 has a width W1 perpendicular to a transmission direction. The width W1 of the first transmission line 42 is equivalent. The second transmission line 44 has a width W2, which is perpendicular to the transmission direction and is equal to the width W1 of the first transmission line 42.

The first transmission line 42 is electrically connected to the first electrode 34. The first electrode 34 is opposed to the first transmission line 42. The first electrode 34 has a width W3, which is not wider than the width W1 of the first transmission line 42. The width W1 of the first transmission line 42 is wider than the width W3 of the first electrode 34. The semiconductor light-emitting device has a first conductor 46 for electrically connecting the modulator 14 and the first transmission line 42. The first conductor 46 may be solder or brazing material and is bonded to the first electrode 34.

The second transmission line 44 is electrically connected to the second electrode 36. The modulator 14 and the second transmission line 44 are connected to each other with a second conductor 48. The second conductor 48 may be a wire and is bonded to the second electrode 36. At least one of the first conductor 46 and the second conductor 48 includes a wire.

The mounting substrate 38 has a ground layer 50 connected to a ground potential. The ground layer 50 is on another surface of the base substrate 40, constituting microstrip lines with the first transmission line 42 and the second transmission line 44. The ground layer 50 has a positional relationship with each portion of the first transmission line 42, where the ground layer 50 is next to the first transmission line 42 on at least one side (only the first side S1 in the embodiment) consisting of a first side S1 along a thickness direction of the mounting substrate 38, and a second side S2 and a third side S3 with the first transmission line 42 interposed between the first and second sides S1, S2.

The first transmission line 42 is bonded to the first electrode 34 and has the width W1 equivalently, at least, at a portion of the first transmission line 42; the portion equivalently has the positional relationship with the ground layer 50, and the portion is next to the ground layer 50 in an equivalent shape along the transmission direction. In the embodiment, due to equivalence in the width W1 of the first transmission line 42, there is no electrical reflection factor arising from shape variation in the first transmission line 42, at the connection portion of the first transmission line 42 and the modulator 14, establishing impedance matching between the connection portion and other regions. Consequently, quality of electric signals in an anode line and a cathode line can be made equal, forming a high-quality optical waveform.

The mounting substrate 38 has a matching resistor 52. The matching resistor 52 is electrically connected between the first transmission line 42 and the second transmission line 44, whereas the first conductor 46 is not interposed between the matching resistor 52 and the first transmission line 42. The matching resistor 52 is electrically connected to the first transmission line 42 before the first conductor 46 in the transmission direction toward the modulator 14. The second conductor 48 is not interposed between the matching resistor 52 and the second transmission line 44. The matching resistor 52 is electrically connected to the second transmission line 44 before the second conductor 48.

Figure 4:
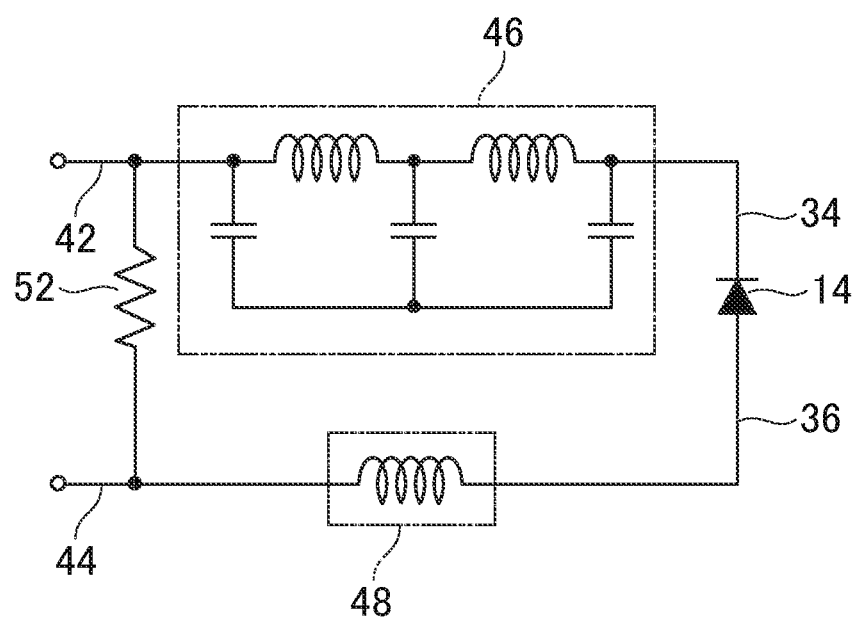
FIG. 4 is a diagram of a partial circuit of the semiconductor light-emitting device.

FIG. 4 is a diagram of a partial circuit of the semiconductor light-emitting device. The modulator 14 is electrically connected between the first transmission line 42 and the second transmission line 44. Connection portions including the first conductor 46 is bonded to the first electrode 34 and constitute a ladder circuit. The ladder circuit includes an inductor and a capacitor connected to each other in parallel. The second conductor 48 (wire) is bonded to the second electrode 36, forming an inductor. In spite of equivalence in the impedances of the first transmission line 42 and the second transmission line 44, there is a factor of differentiating the characteristic impedances in the route to the modulator 14. As mentioned in Problem 3, the matching resistor 52 should not be placed past the factor of differentiating the characteristic impedances. In the embodiment, the matching resistor 52 is provided before the factor of differentiating the characteristic impedances toward the modulator 14. The embodiment can make the impedance matching in the transmission route before the first conductor 46 and the second conductor 48.

Figure 5:
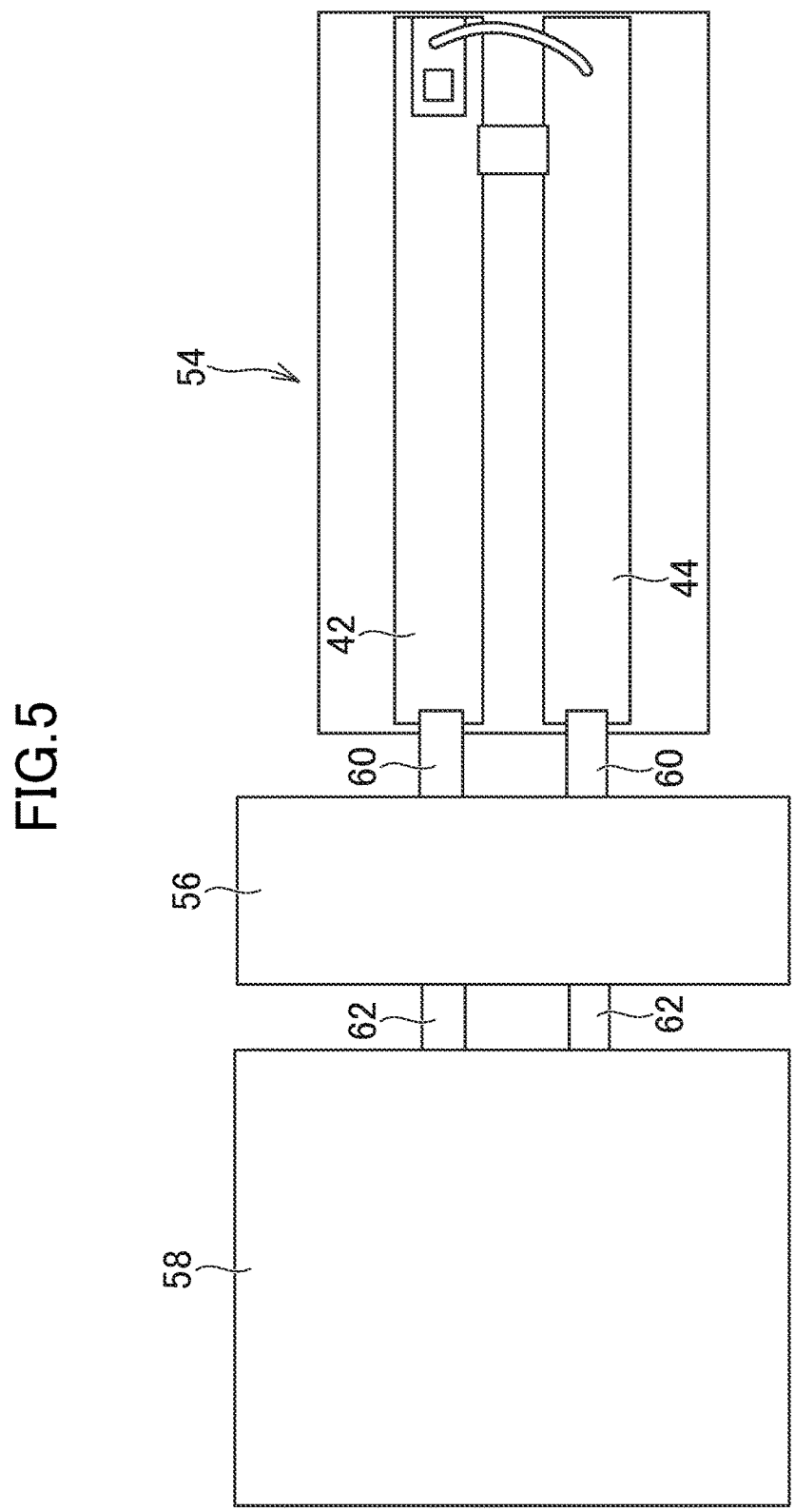
FIG. 5 is a schematic view of the optical module including the semiconductor light-emitting device in the first embodiment.

FIG. 5 is a schematic view of the optical module including the semiconductor light-emitting device in the first embodiment. The semiconductor light-emitting device 54 is connected to an integrated circuit 58 through a relay substrate 56. Specifically, the first transmission line 42 and the second transmission line 44 are connected to the relay substrate 56 with respective traces 60 (signal lines or wires). The relay substrate 56 and the integrated circuit 58 are connected to each other with a pair of traces 62 (signal lines or wires) for transmitting differential signals.

Variation 1 of First Embodiment

Figure 6:
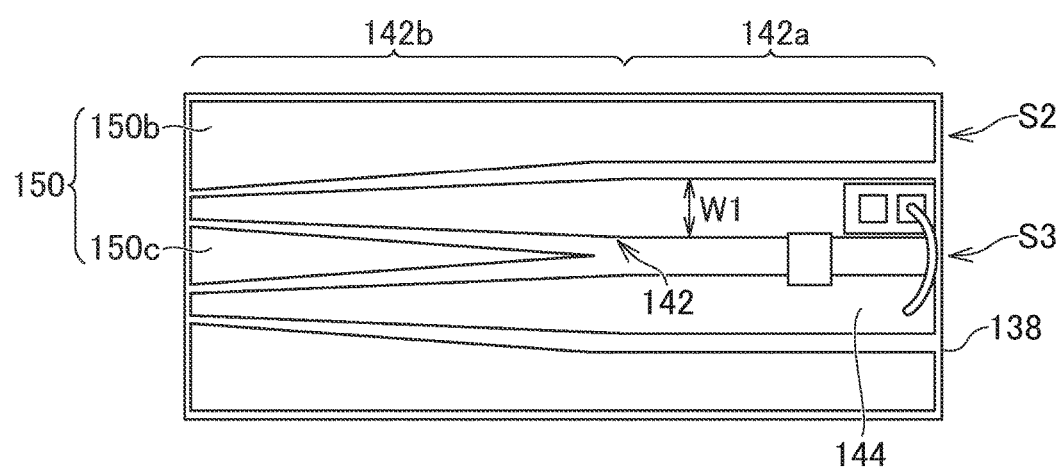
FIG. 6 is a plan view of the semiconductor light-emitting device in Variation 1 of the first embodiment.
Figure 7:
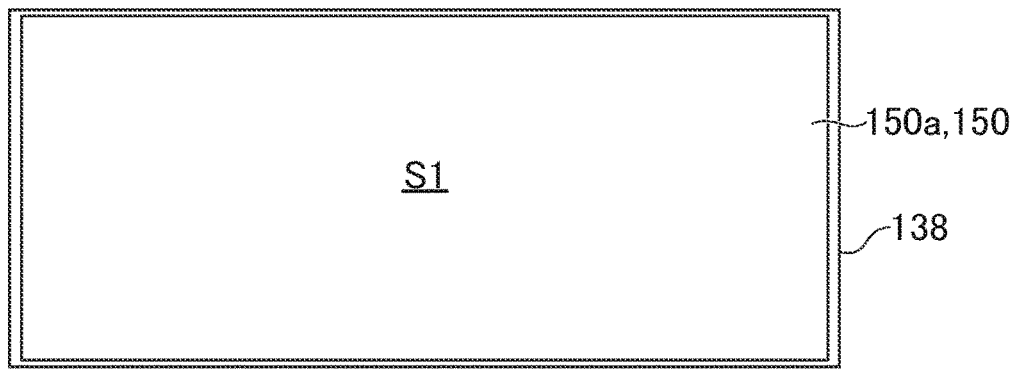
FIG. 7 is a bottom view of the semiconductor light-emitting device in FIG. 6.

FIG. 6 is a plan view of the semiconductor light-emitting device in Variation 1 of the first embodiment. FIG. 7 is a bottom view of the semiconductor light-emitting device in FIG. 6.

The first transmission line 142 has a first transmission portion 142a. The first transmission line 142 has a width W1, which is equivalent at the first transmission portion 142a. The first transmission portion 142a includes an opposed region to the first electrode 34 (FIG. 3). The first transmission line 142 has a second transmission portion 142b connected to the first transmission portion 142a.

The ground layer 150 has a first ground portion 150a next to the first transmission portion 142a on the first side S1. The ground layer 150 has a second ground portion 150b next to the first transmission portion 142a on the second side S2. The ground layer 150 has no ground portion next to the third side S3, opposite to the second side S2. By contrast, the ground layer 150 has a third ground portion 150c next to at least a portion of the second transmission portion 142b on the third side S3, in addition to the first ground portion 150a and the second ground portion 150b. The first transmission portion 142a has a so-called GSSG line configuration; the second transmission portion 142b is a mediation area changing into the GSGSG line configuration with the impedance value unchanged.

The first transmission line 142 at the first transmission portion 142a is bonded to the first electrode 34 (FIG. 3) with the width W1 equivalent. The first transmission portion 142a has an equivalent positional relationship with the ground layer 150. The ground layer 150 is next to the whole first transmission portion 142a on the first side S1 in a thickness direction of the mounting substrate 138 and on only one of the second and third sides S2, S3 with the first transmission line 142 interposed therebetween. The first transmission portion 142a is next to the ground layer 150 (second ground portion 150b) in an equivalent shape along the transmission direction. In the variation, due to equivalence in the width W1 of the first transmission portion 142a, impedance matching can be made between a connection portion to the modulator 14 and another area, allowing modification of the line configurations of the first transmission line 142 and the second transmission line 144, as long as the impedance values are kept unchanged, without impairing the effect of the invention. The same may be applied to the second transmission line 144.

Variation 2 of First Embodiment

Figure 8:
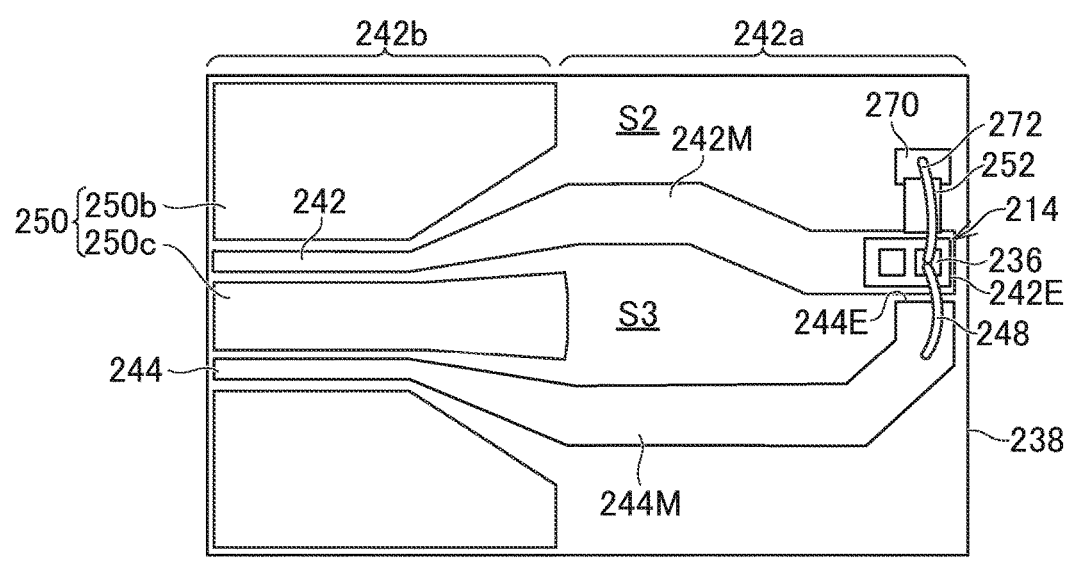
FIG. 8 is a plan view of Variation 2 of the semiconductor light-emitting device in the first embodiment.
Figure 9:
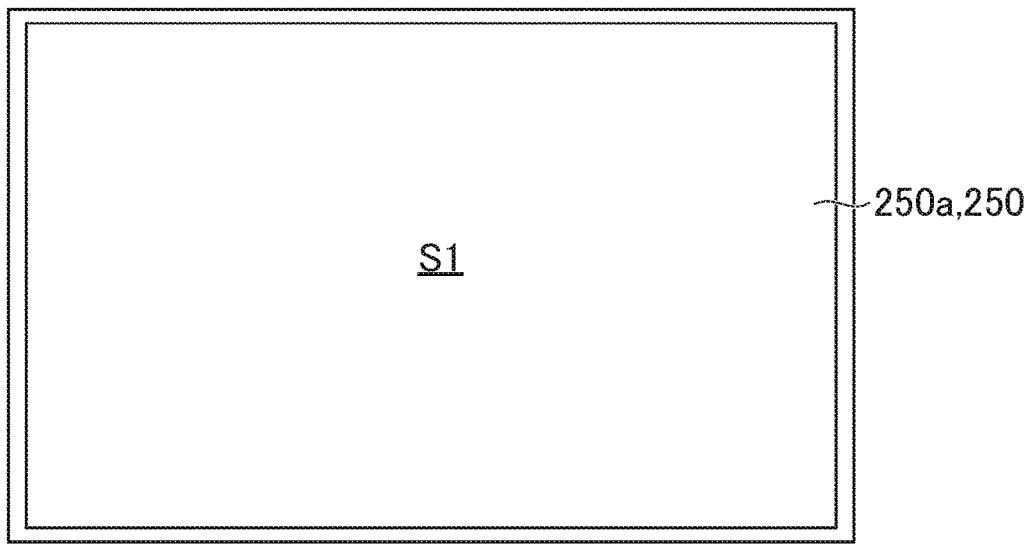
FIG. 9 is a bottom view of the semiconductor light-emitting device in FIG. 8.

FIG. 8 is a plan view of Variation 2 of the semiconductor light-emitting device in the first embodiment. FIG. 9 is a bottom view of the semiconductor light-emitting device in FIG. 8.

The first transmission line 242 and the second transmission line 244 has respective portions 242M, 244M most remote from each other, thereby preventing crosstalk. The first transmission line 242 and the second transmission line 244 extend to be closer to each other from both sides of the respective portions 242M, 244M most remote from each other. The first transmission line 242 and the second transmission line 244 have respective portions speced at varying distances. The first transmission line 242 has an opposed region to the first electrode 34 (FIG. 3) and a first transmission portion 242a including the portion 242M most remoted from the second transmission line 244. The first transmission line 242 has a second transmission portion 242b connected to the first transmission portion 242a. The second transmission portion 242b extends from the first transmission portion 242a in a direction away from the modulator 214.

The first transmission line 242 and the second transmission line 244 have asymmetrical planar shapes. This is because the first transmission line 242 is electrically connected to the modulator 214 by means of its mounting but the second transmission line 244 is electrically connected thereto through the second conductor 248 (wire).

The first transmission line 242 and the second transmission line 244 have a same line length. The line length is a total value of portions extending in every direction, in a shape of bending in some directions shown in FIG. 8, for example. The "equivalent" means up to ±20%. The difference of the line length between the first and second transmission lines 242, 244 is preferably within ±10% although a ±20% difference causes no practical problem.

The first transmission line 242 has one end 242E of the line length at a position beyond an electrical connection portion to the modulator 214 (first electrode 34 in FIG. 3) in a transmission direction. The second transmission line 244 has one end 244E of the line length to be closest to the first transmission line 242 on a side of the modulator 214. This makes the second conductor 248 (wire) not long for electrical connection between the modulator 214 and the second transmission line 244.

The ground layer 250 has a first ground portion 250a next to the first transmission portion 242a and the second transmission portion 242b on the first side S1 along a thickness direction of the mounting substrate 238. The ground layer 250 has a second ground portion 250b and a third ground portion 250c next to at least the second transmission portion 242b on the second and third sides S2, S3 with the first transmission line 242 interposed therebetween. The second transmission portion 242b is interposed between the second ground portion 250b and the third ground portion 250c. The second ground portion 250b and the third ground portion 250c may be next to the first transmission portion 242a as well.

The first transmission portion 242a is next to the first ground portion 250a but next to neither the second ground portion 250b nor the third ground portion 250c. The first transmission portion 242a has a so-called GSSG line configuration; the second transmission portion 242b is a mediation area changing into the microstrip line configuration with the impedance value unchanged. The first transmission portion 242a is next to the ground layer 250 in an equivalent shape along the signal transmission direction. FIG. 8 shows that the first transmission line 242 has a width (width perpendicular to the transmission direction) equivalent at the first transmission portion 242a.

The matching resistor 252 is electrically connected between the first transmission line 242 and the second transmission line 244 with a second electrode 236. Specifically, a matching resistor electrode 270 is next to the first transmission line 242 on a side opposite to the second transmission line 244. The matching resistor electrode 270 is next to the modulator 214 as well. The matching resistor 252 is electrically connected between the matching resistor electrode 270 and first transmission line 242. The wire 272 connects the matching resistor electrode 270 and the second electrode 236. The second electrode 236 is electrically connected to the second transmission line 244 through the second conductor 248 (wire).

Second Embodiment

Figure 10:
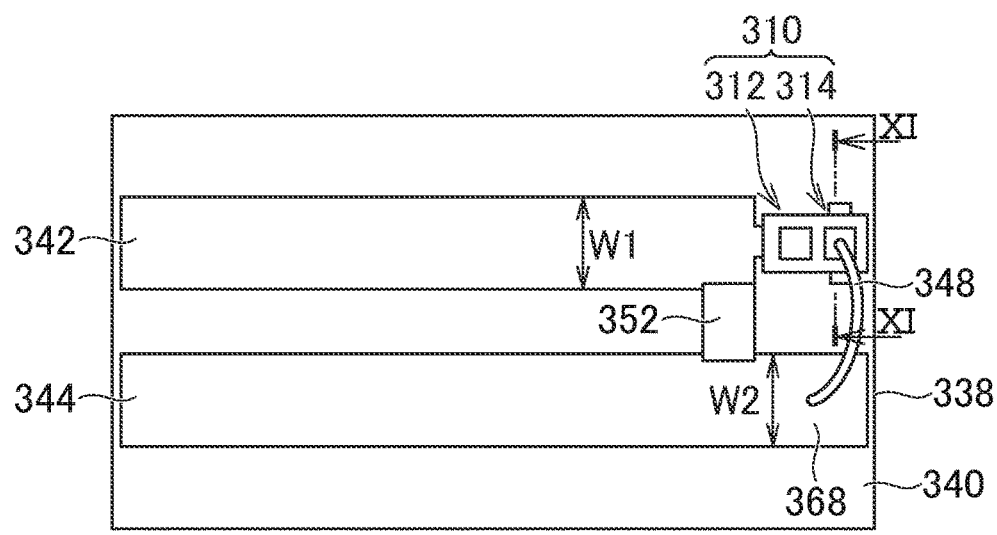
FIG. 10 is a plan view of a semiconductor light-emitting device in accordance with a second embodiment.

FIG. 10 is a plan view of a semiconductor light-emitting device in accordance with a second embodiment.

The semiconductor light-emitting device has a light-emitting modulation element 310. The light-emitting modulation element 310 has a light source 312 and a modulator 314, the details of which are explained in the first embodiment.

Figure 11:
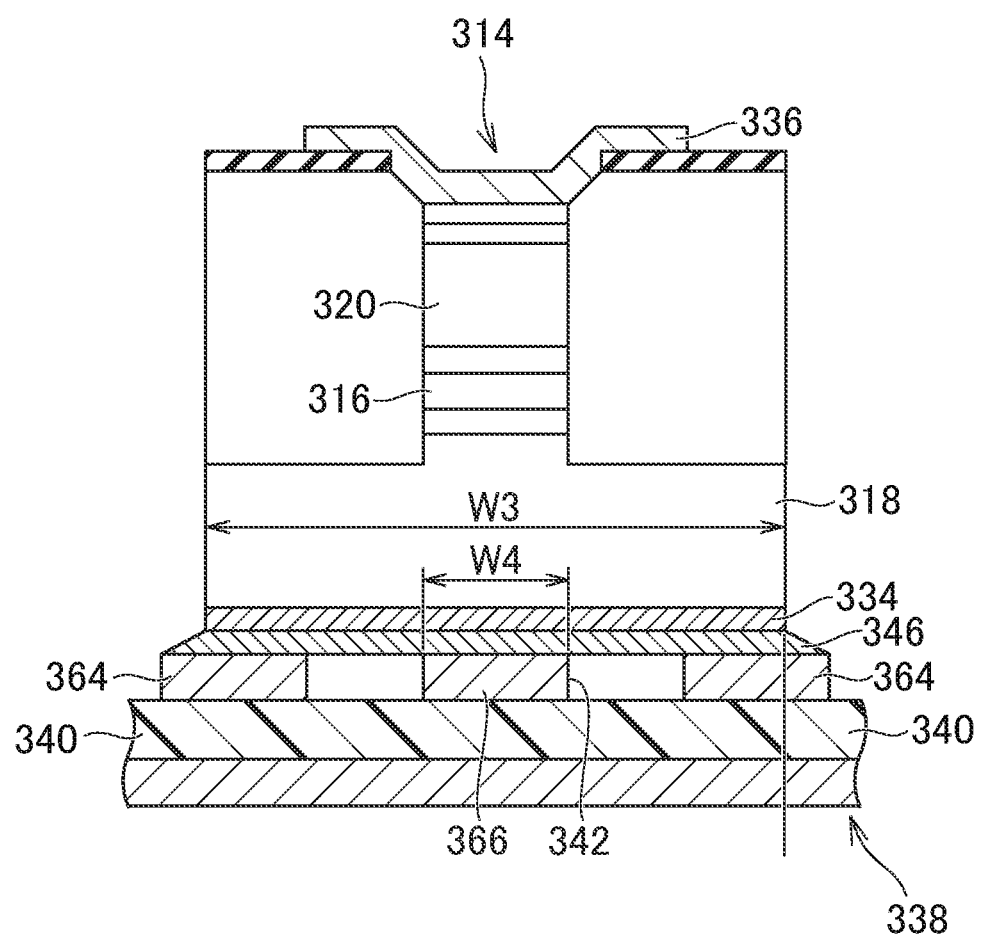
FIG. 11 is an enlarged XI-XI line sectional view of the semiconductor light-emitting device in FIG. 10.

FIG. 11 is an enlarged XI-XI line sectional view of the semiconductor light-emitting device in FIG. 10. The modulator 314 is configured to have a first conductivity-type semiconductor layer 318 and a second conductivity-type semiconductor layer 320 with a quantum well layer 316 interposed therebetween, for modulating output light from the light source 312. The modulator 314 has a first electrode 334 electrically connected to and laminated on the first conductivity-type semiconductor layer 318. The modulator 314 has a second electrode 336 electrically connected to and laminated on the second conductivity-type semiconductor layer 320.

The semiconductor light-emitting device has a mounting substrate 338. A light-emitting modulation element 310 (light source 312 and modulator 314) is mounted on the mounting substrate 338. The modulator 314 is mounted junction-up with the quantum well layer 316 on a top side. The mounting substrate 338 has a base substrate 340 made from insulation materials, for example. The mounting substrate 338 has studs 364 on at least one of both sides interposing the first transmission line 342 therebetween. The modulator 314 is mounted on the first transmission line 342 and the studs 364.

Figure 12:
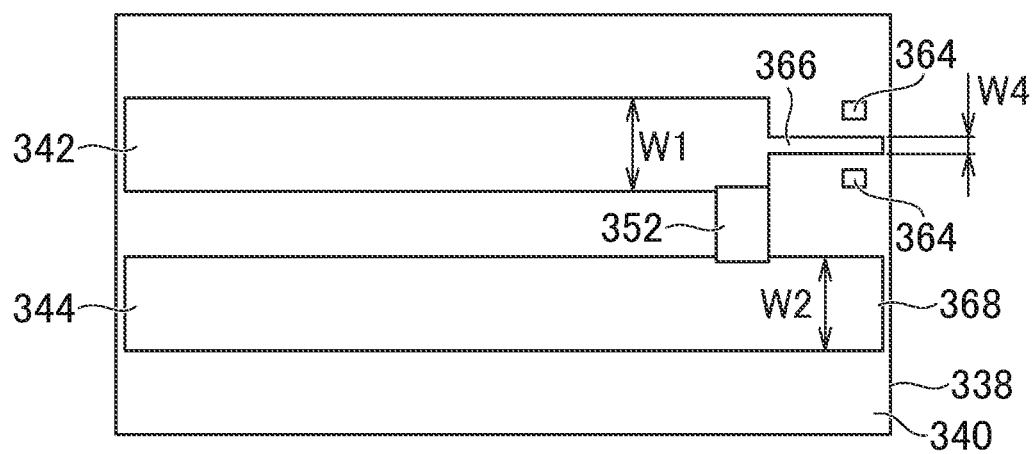
FIG. 12 is a diagram of a mounting substrate.

FIG. 12 is a diagram of the mounting substrate 338. The mounting substrate 338 has the first transmission line 342. The first transmission line 342 extends from a first connection portion 366 electrically connected to the first conductivity-type semiconductor layer 318. The first electrode 334 is opposed and bonded to the first connection portion 366. The width W3 of the first electrode 334 is larger than the width W4 of the first connection portion 366. The stud 364 is on at least one of both sides interposing the first connection portion 366, without direct connection with the first connection portion 366. The width W1 of the first transmission line 342 is, except for the first connection portion 366, larger than the width W3 of the first electrode 334.

At least one of the first electrode 334 and the second electrode 336 is opposed to and electrically connected to the first transmission line 342 or the second transmission line 344. The semiconductor light-emitting device has a first conductor 346 electrically connecting the modulator 314 and the first transmission line 342. The first conductor 346 may be solder or brazing material, being bonded to the first electrode 334.

The first connection portion 366 has a width W4, which is perpendicular to the transmission direction and less than the width W1 of its adjoining part. The width W4 of the first connection portion 366 is less than the width W1 of the adjoining part. The first connection portion 366 has higher characteristic impedance than the adjoining part. In the embodiment, in spite of the difference of the characteristic impedance between the first conductivity-type semiconductor layer 318 and the second conductivity-type semiconductor layer 320, due to higher characteristic impedance of the first connection portion 366 than the adjoining part, impedance matching can be made. The embodiment illustrates the first connection portion 366 in a strait shape, but a variety of modifications thereto are possible for lowering impedance difference between sides of the first conductivity-type semiconductor layer 318 and the second conductivity-type semiconductor layer 320, to make the characteristic impedance desirable.

The mounting substrate 338 has a second transmission line 344. The first transmission line 342 and the second transmission line 344 constitute a pair of differential signal lines. The second transmission line 344 extends from the second connection portion 368 electrically connected to the second conductivity-type semiconductor layer 320. The second connection portion 368 and its adjoining part have the same width W2. The semiconductor light-emitting device has a second conductor 348 electrically connecting the modulator 314 and the second transmission line 344. The second conductor 348 is bonded to the second electrode 336. At least one of the first conductor 346 and the second conductor 348 includes a wire.

The mounting substrate 338 has a matching resistor 352. The matching resistor 352 is electrically connected between the first transmission line 342 and the second transmission line 344, without interposing the first conductor 346 between the matching resistor 352 and the first transmission line 342. The matching resistor 352 is electrically connected to the first transmission line 342 before the first conductor 346 in the transmission direction toward the modulator 314. The second conductor 348 is not interposed between the matching resistor 352 and the second transmission line 344. The matching resistor 352 is electrically connected to the second transmission line 344 before the second conductor 348. The embodiment can make the impedance matching in the transmission route before the first conductor 346 and the second conductor 348.

Figure 13:
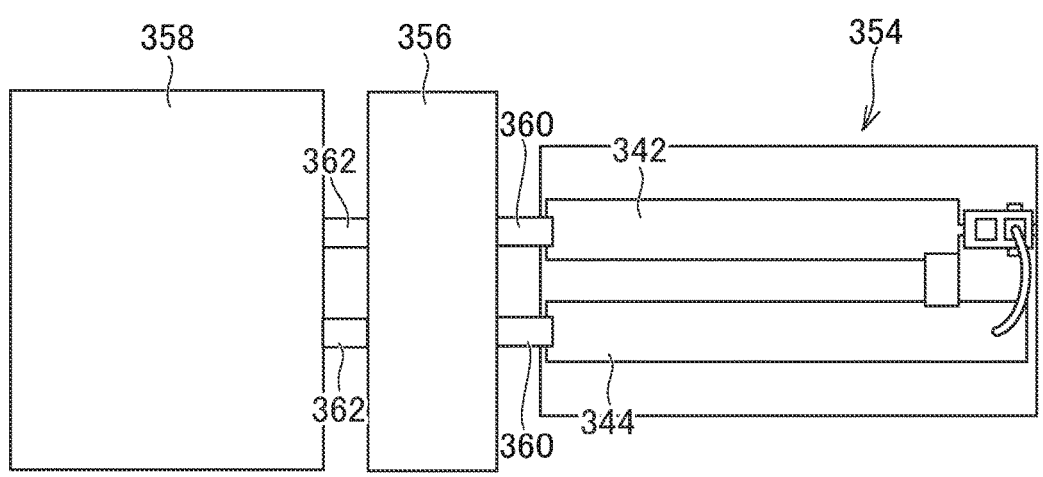
FIG. 13 is a schematic view of an optical module including the semiconductor light-emitting device in the second embodiment.

FIG. 13 is a schematic view of an optical module including the semiconductor light-emitting device in the second embodiment. The semiconductor light-emitting device 354 is connected to the integrated circuit 358 through the relay substrate 356. Specifically, the first transmission line 342 and the second transmission line 344 are connected to the relay substrate 356 through respective traces 360 (signal lines or wires). The relay substrate 356 and the integrated circuit 358 are connected to each other with a pair of traces 362 (signal lines or wires) to transmit differential signals.

Variation of Second Embodiment

Figure 14:
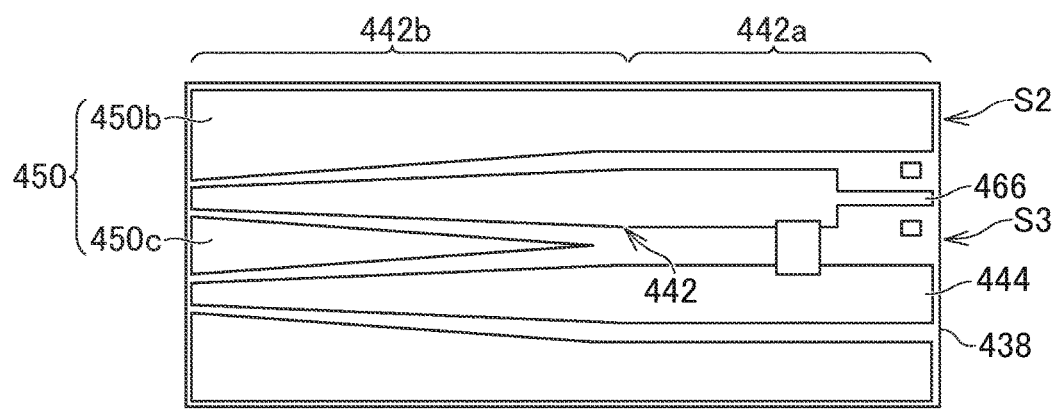
FIG. 14 is a plan view of the semiconductor light-emitting device in a variation of the second embodiment.

FIG. 14 is a plan view of the semiconductor light-emitting device in a variation of the second embodiment.

Figure 15:
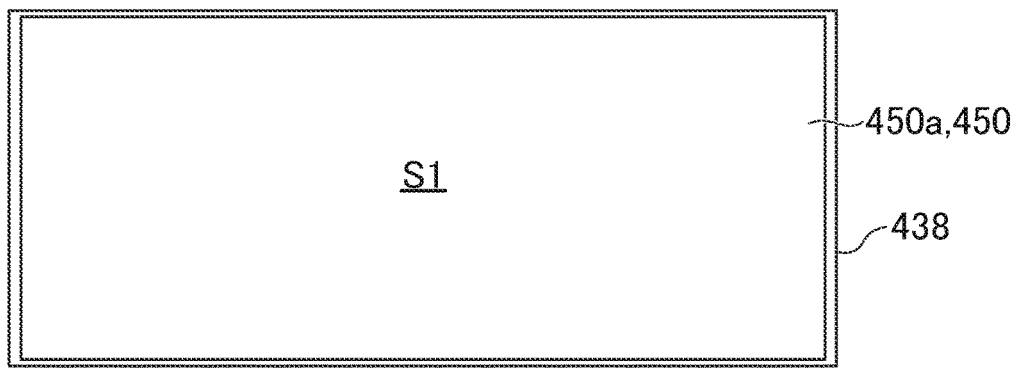
FIG. 15 is a bottom view of the semiconductor light-emitting device in FIG. 14.

FIG. 15 is a bottom view of the semiconductor light-emitting device in FIG. 14.

The first transmission line 442 has a first transmission portion 442a. The first transmission portion 442a includes an opposed region (first connection portion 466) to the first electrode 334 (FIG. 11). The first transmission line 442 has a second transmission portion 442b connected to the first transmission portion 442a.

The ground layer 450 has a first ground portion 450a next to the first transmission portion 442a on the first side S1. The ground layer 450 has a second ground portion 450b next to the first transmission portion 442a on the second side S2, without any ground portion next thereto on the third side S3 opposite to the second side S2. By contrast, the ground layer 450 has a third ground portion 450c next to at least a portion of the second transmission portion 442b on the third side S3, in addition to the first ground portion 450a and the second ground portion 450b. The first transmission portion 442a has a so-called GSSG line configuration; the second transmission portion 442b is a mediation area changing into the GSGSG line configuration with the impedance value unchanged.

The first transmission line 442 at the first transmission portion 442a is bonded to the first electrode 334 (FIG. 11). The first transmission portion 442a has an equivalent positional relationship with the ground layer 450. The ground layer 450 is next to the whole first transmission portion 442a, on the first side S1 in a thickness direction of the mounting substrate 438 and on only one of the second and third sides S2, S3 with the first transmission line 442 interposed therebetween. The first transmission portion 442a is next to the ground layer 450 in an equivalent shape along the transmission direction. The embodiment allows modification of line configurations to the differential transmission lines consisting of the first transmission line 442 and another line, as long as the impedance values are kept unchanged, without impairing the effect of the invention. The same may be applied to the second transmission line 444.

While there have been described what are at present considered to be certain embodiments, it will be understood that various modifications may be made thereto, and it is intended that the appended claims cover all such modifications as fall within the true spirit and scope of the invention.

What is claimed is:

1. Semiconductor light-emitting device comprising:
a light source;
a modulator for modulating output light from the light source, the modulator having a first electrode and a second electrode; and
a mounting substrate on which the light source and the modulator are mounted, the mounting substrate having a first transmission line electrically connected to the first electrode, the mounting substrate having a second transmission line electrically connected to the second electrode, the mounting substrate having a ground layer connected to a ground potential,
wherein
the first transmission line and the second transmission line constitute a pair of differential signal lines,
the first transmission line has a width perpendicular to a transmission direction,
the first electrode has a width not exceeding the width of the first transmission line, the first electrode being opposed to the first transmission line,
the ground layer has a positional relationship with each portion of the first transmission line, where the ground layer is next to the first transmission line on at least one side consisting of a first side along a thickness direction of the mounting substrate, and a second side and a third side with the first transmission line interposed therebetween, and
the first transmission line is bonded to the first electrode and has the width equivalently, at least, at a portion of the first transmission line, the portion equivalently having the positional relationship with the ground layer, the portion being next to the ground layer in an equivalent shape along the transmission direction.

2. The semiconductor light-emitting device according to claim 1, wherein
the modulator has a quantum well layer for absorbing the output light, and a first conductivity-type semiconductor layer and a second conductivity-type semiconductor layer with the quantum well layer interposed therebetween,
the first electrode is on the first conductivity-type semiconductor layer for electrical connection,
the second electrode is on the second conductivity-type semiconductor layer for electrical connection, and
the first electrode and the second electrode face opposite directions.

3. The semiconductor light-emitting device according to claim 1, wherein the second transmission line has a width that is perpendicular to a transmission direction and is equal to the width of the first transmission line.

4. The semiconductor light-emitting device according to claim 1, wherein the width of the first transmission line is larger than the width of the first electrode.

5. The semiconductor light-emitting device according to claim 1, wherein
the first transmission line has a first transmission portion including an opposed region to the first electrode, the first transmission line having a second transmission portion connected to the first transmission portion,
the ground layer has a first ground portion next to the first transmission portion on the first side, the ground layer having only one of a second ground portion next to the first transmission portion on the second side and a third ground portion next to the first transmission portion on the third side,
the ground layer has the first ground portion, the second ground portion, and the third ground portion next to at least a part of the second transmission portion, and
the width of the first transmission line at the first transmission portion is equivalent.

6. The semiconductor light-emitting device according to claim 1, wherein
the first transmission line and the second transmission line have respective planar shapes asymmetrical to each other, respective portions most remote from each other, and respective portions spaced apart from each other at various distances, and
the first transmission line and the second transmission line have a same line length.

7. The semiconductor light-emitting device according to claim 6, wherein the second transmission line has one end of the line length closest to the first transmission line on a side of the modulator.

8. The semiconductor light-emitting device according to claim 6, wherein the first transmission line has one end of the line length beyond an electrical connection portion with the first electrode in the transmission direction.

9. The semiconductor light-emitting device according to claim 6, wherein the first transmission line and the second transmission line extend to be closer to each other from both sides of the respective portions most remote from each other.

10. The semiconductor light-emitting device according to claim 6, wherein
the first transmission line has a first transmission portion including an opposed region to the first electrode and a portion most remote from the second transmission line, the first transmission line having a second transmission portion for connection with the first transmission portion, and
the ground layer has a first ground portion next to the first transmission portion and the second transmission portion on the first side, the ground layer having a second ground portion next to at least the second transmission portion on the second side, the ground layer having a third ground portion next to at least the second transmission portion on the third side.

11. The semiconductor light-emitting device according to claim 6, further comprising:
a matching resistor electrode next to the first transmission line; and
a matching resistor electrically connected between the first transmission line and the matching resistor electrode,
wherein the second transmission line is electrically connected with the matching resistor through the second electrode and the matching resistor electrode.

12. The semiconductor light-emitting device according to claim 1, wherein the light source and the modulator are mounted on a common substrate.

13. Semiconductor light-emitting device comprising:
a light source;
a modulator configured to have a quantum well layer for modulating output light from the light source interposed between a first conductivity-type semiconductor layer and a second conductivity-type semiconductor layer; and
a mounting substrate on which the light source and the modulator are mounted, the mounting substrate having a first transmission line extending from a first connection portion electrically connected to the first conductivity-type semiconductor layer, the mounting substrate having a second transmission line extending from a second connection portion electrically connected to the second conductivity-type semiconductor layer,
wherein
the first transmission line and the second transmission line constitute a pair of differential signal lines, and
the first transmission line has a width in a direction perpendicular to a transmission direction, the first connection portion having the width less than or equal to an adjoining part thereof, the first connection portion having characteristic impedance higher than the adjoining part.

14. The semiconductor light-emitting device according to claim 13, wherein the first connection portion has the width less than the adjoining part.

15. The semiconductor light-emitting device according to claim 13, wherein the modulator is mounted junction-up with the quantum well layer on a top side.

16. The semiconductor light-emitting device according to claim 13, wherein
the modulator has a first electrode electrically connected to and laminated on the first conductivity-type semiconductor layer and a second electrode electrically connected to and laminated on the second conductivity-type semiconductor layer, and
the first electrode is opposed to and bonded to the first connection portion.

17. The semiconductor light-emitting device according to claim 16, wherein the first electrode is wider than the width of the first connection portion.

18. The semiconductor light-emitting device according to claim 16, wherein the first transmission line, except for the first connection portion, has the width larger than the first electrode.

19. The semiconductor light-emitting device according to claim 13, wherein the mounting substrate has a stud on at least one of both sides interposing the first connection portion therebetween, and the modulator is mounted on the first connection portion and the stud.

20. Semiconductor light-emitting device comprising:
a light source;
a modulator for modulating output light from the light source;
a mounting substrate on which the light source and the modulator are mounted, the mounting substrate having a first transmission line, a second transmission line, and a matching resistor;
a first conductor for electrically connecting the modulator to the first transmission line; and
a second conductor for electrically connecting the modulator to the second transmission line,
wherein
the first transmission line and the second transmission line constitute a pair of differential signal lines, and
the matching resistor is connected between the first transmission line and the second transmission line, without the first conductor or the second conductor being interposed therebetween.

21. The semiconductor light-emitting device according to claim 20, wherein the matching resistor is electrically connected to the first transmission line before the first conductor in a transmission direction toward the modulator, and the matching resistor is electrically connected to the second transmission line before the second conductor.

22. The semiconductor light-emitting device according to claim 20, wherein
the modulator has a first electrode and a second electrode, the first conductor is bonded to the first electrode, and the second conductor is bonded to the second electrode.

23. The semiconductor light-emitting device according to claim 22, wherein at least one of the first conductor and the second conductor includes a wire.

24. The semiconductor light-emitting device according to claim 22, wherein at least one of the first electrode and the second electrode is opposed to and electrically connected to the first transmission line or the second transmission line.

* * * * *